United States Patent [19]

Tatematsu

[11] Patent Number: 5,138,419
[45] Date of Patent: Aug. 11, 1992

[54] WAFER SCALE INTEGRATION DEVICE WITH DUMMY CHIPS AND RELAY PADS

[75] Inventor: Takeo Tatematsu, Yokohama, Japan

[73] Assignee: Fujitsu Limited, Kanagawa, Japan

[21] Appl. No.: 707,936

[22] Filed: May 28, 1991

Related U.S. Application Data

[63] Continuation of Ser. No. 359,677, May 31, 1989, abandoned.

[30] Foreign Application Priority Data

Jun. 1, 1988 [JP] Japan ................. 63-132589

[51] Int. Cl.⁵ .......................................... H01L 27/02
[52] U.S. Cl. .......................................... 357/40; 357/45
[58] Field of Search ................................ 357/40, 45

[56] References Cited

U.S. PATENT DOCUMENTS

| | | | |
|---|---|---|---|
| 4,703,436 | 10/1987 | Varshney | 357/45 |
| 5,032,889 | 7/1991 | Murao et al. | 357/45 |

FOREIGN PATENT DOCUMENTS

| | | | |
|---|---|---|---|
| 0128799 | 12/1984 | European Pat. Off. | |
| 55-68668 | 5/1980 | Japan | 357/40 |
| 57-79655 | 5/1982 | Japan | 357/40 |
| 58-143550 | 8/1983 | Japan | 357/45 |
| 59-107532 | 6/1984 | Japan | 357/40 |
| 59-197151 | 11/1984 | Japan | 357/45 |
| 60-20526 | 2/1985 | Japan | 357/40 |
| 60-49648 | 3/1985 | Japan | 357/45 |
| 60-240140 | 11/1985 | Japan | 357/45 |
| 61-30044 | 2/1986 | Japan | 357/45 |
| 61-87349 | 5/1986 | Japan | 357/40 |
| 61-214559 | 9/1986 | Japan | 357/45 |
| 62-179755 | 8/1987 | Japan | 357/45 |
| 62-219957 | 9/1987 | Japan | 357/40 |
| 62-238637 | 10/1987 | Japan | 357/45 |
| 62-224056 | 3/1988 | Japan | . |
| 63-114246 | 5/1988 | Japan | 357/45 |
| 2178204A | 2/1987 | United Kingdom | . |

OTHER PUBLICATIONS

"Wafer-scale integration", Catt, *Wireless World*, Jul. 1981.
"WASP-A Wafer-scale Systolic Processor" by Hedlund, IEEE International Conference on Computer Design, 1985.

*Primary Examiner*—Rolf Hille
*Assistant Examiner*—Steven Loke
*Attorney, Agent, or Firm*—Nikaido, Marmelstein, Murray & Oram

[57] ABSTRACT

A wafer scale integration device comprises a plurality of real chips formed in the center portion of a wafer and a plurality of dummy chips formed in the circumference of the wafer. The dummy chips only include relay pads, some of the relay pads are used for relaying bonding wires of power supply lines. Consequently, the power supply lines do not short-circuit at edge portions of the wafer, since a length of the bonding wire at the edge portion of the wafer becomes short due to the relay pad connected to the bonding wire.

17 Claims, 10 Drawing Sheets

WAFER SCALE INTEGRATION DEVICE WITH DUMMY CHIPS AND RELAY PADS

This application is a continuation of application Ser. No. 359,677 filed May 31, 1989, now abandoned.

BACKGROUND OF THE INVENTION

1. Field of the Invention

The present invention relates to a wafer scale integration (WSI) device, more particularly, to a wafer scale integration device using a bonding wire for supplying power supply voltages or common signals to a plurality of chips formed on the wafer.

The wafer scale integration device is used for a memory, a logic circuit and the like. In such a wafer scale integration device, for example, a power supply line is formed by bonding wires, since the power supply line should have low impedance characteristics and a bonding wire has low impedance characteristics. Furthermore, the bonding wire is not only used for the power supply line, but also a common signal line which requires low impedance characteristics.

2. Description of the Related Art

Recently, a wafer scale integration device, which is used for a memory, a logic circuit and the like, has been developed and prototype devices has been provided. In the wafer scale integration device, a plurality of circuits are integrated in all regions of the wafer. For example, in a wafer scale memory device which is one kind of a wafer scale integration device, a wafer includes an array of chips each having a memory circuit and additional control logic circuit.

In the art of wafer scale integration, the following merits are provided. First, a larger scale circuit can be integrated on the wafer than any other large scale integrated circuit (LSI). Next, a signal delay time can be shortened, since a mutual wiring distance between circuits becomes shorter by integrating a system on one piece of wafer. Further, reliability of the system can be improved by compensating for defective chips of the wafer or defective portions in the chip, and reliability of mounting can be improved by decreasing assembling processes.

As described above, the wafer scale integration device is suitable for constituting a monolithic memory or a repeated logical circuit including a plurality of basic configurations. In the monolithic wafer scale integration device, a circuit should be integrated in all regions in the wafer which may include defective portions, and thus the method of constituting the system by providing redundancy and bypassing the defective chips of the wafer or defective portions of the chip becomes indispensable to increasing the effective production yield to a practical level.

For example, in the wafer scale memory device, when a direction of a main orientation flat is assumed as an X-direction and a direction of crossing at a right angle to the main orientation flat is assumed as a Y-direction, each of the X-direction and Y-direction between neighboring chips are connected by local lines. When a signal is applied to an input of the wafer scale memory device, the signal bypasses defective chips and passes only operative chips serially, and appears at an output of the wafer scale memory device. Further, in the Y-direction, global lines each consisting of a command line (CMND) and a wafer clock line (WCK), Vcc lines, Vss lines, and $V_{BB}$ lines are connected in parallel by each chip array. Related art of the wafer scale integration device is disclosed in Japanese Patent Publication Nos. 58-18778 and 62-6267. Note, each of the above chips is not connected directly by the local lines, but a logic circuit is inserted therebetween.

It should be noted that the term "chip" here is used to mean a unit for forming a unit functional block like a unit memory block which is formed on a wafer to occupy a separate unit area and is connectable to adjacent one by a conductor pattern and/or a wire, but is not used to mean a physically independent unit severed from a wafer.

The wafer is cut into a square shape by cutting along the X-direction and Y-direction at the periphery thereof except for the corners, and the cut wafer is mounted on a base member called a carrier for actual use. Further, as known by persons with ordinary skill in the art, the operative chips are connected in serial bypassing defective chips, in a construction called a SPIRAL path.

In the wafer scale integration device, a mutual wiring distance of each of the chips becomes short in a plurality of diced chips connected by wirings. But, when power supply lines such as Vcc lines or Vss lines are constituted by metal wiring made of aluminium, a problem arises since resistance values of the metal wiring is large. Namely, the power supply lines are used for supplying power supply voltages of Vcc or Vss to a plurality of chips, a potential drop in supplied voltages is caused by the large resistance values of the metal wirings, and thus some chips may not be supplied with a sufficient potential of the power supply voltages of Vcc or Vss. Another problem arises in a cutting region of the wafer cut by a cutting blade. And further, when the global lines and the local lines are constituted by metal wiring made of aluminium and the like, a problem arises that these lines may be short-circuited by the circumference of the wafer.

SUMMARY OF THE INVENTION

It is an object of the present invention to provide a wafer scale integration circuit for preventing a short circuit of power supply lines using bonding wires, global lines and local lines at edge portions of a wafer, and to easily perform a cutting of the wafer so as not to cause problems in the future.

According to the present invention, there is provided a wafer scale integration device comprising, a wafer, a plurality of real chips selectively formed in the center portion of the wafer, each of the real chips having an actual circuit and a plurality of real pads, a plurality of bonding wires which connect each of the real pads, and a plurality of dummy chips selectively formed in the circumference of the wafer, each of the dummy chips having a plurality of relay pads, and some of the bonding wires being selectively connected to corresponding ones of the relay pads.

The bonding wires connected to the relay pads may be used for supplying power supply voltages to the real chips.

Further, according to the present invention, there is provided a wafer scale integration device comprising, a wafer, a plurality of real chips selectively formed in the center portion of the wafer, each of the real chips having an actual circuit, and a plurality of dummy chips selectively formed in the circumference of the wafer, each of the dummy chips having no actual circuit, and each of the dummy chips includes a scribe line for cutting the wafer.

A metal film and a cover film may not be formed on the scribe line.

Furthermore, according to the present invention, there is provided a wafer scale integration device comprising, a wafer, a plurality of real chips selectively formed in the wafer, each of the real chips having an actual circuit, and a plurality of dummy chips selectively formed in the circumference of the wafer instead of real chips in the circumference of the wafer, each of the dummy chips having no actual circuit.

Each of the real chips may include global lines for transmitting common signals and local lines for electrically connecting each of the real chips to neighboring real chips thereof, and the global lines close to the boundary portion between some of the real chips may be divided to enable the local lines to pass through.

The boundary portion between some of the real chips may be arranged as an array in the center of the wafer.

The global lines may comprise a WCK line for transmitting a wafer clock signal and a CMND line for transmitting a command strobe signal.

A metal film may not be formed at the circumference of each of the dummy chips, so that the global lines and local lines do not short-circuit.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Figure 1:
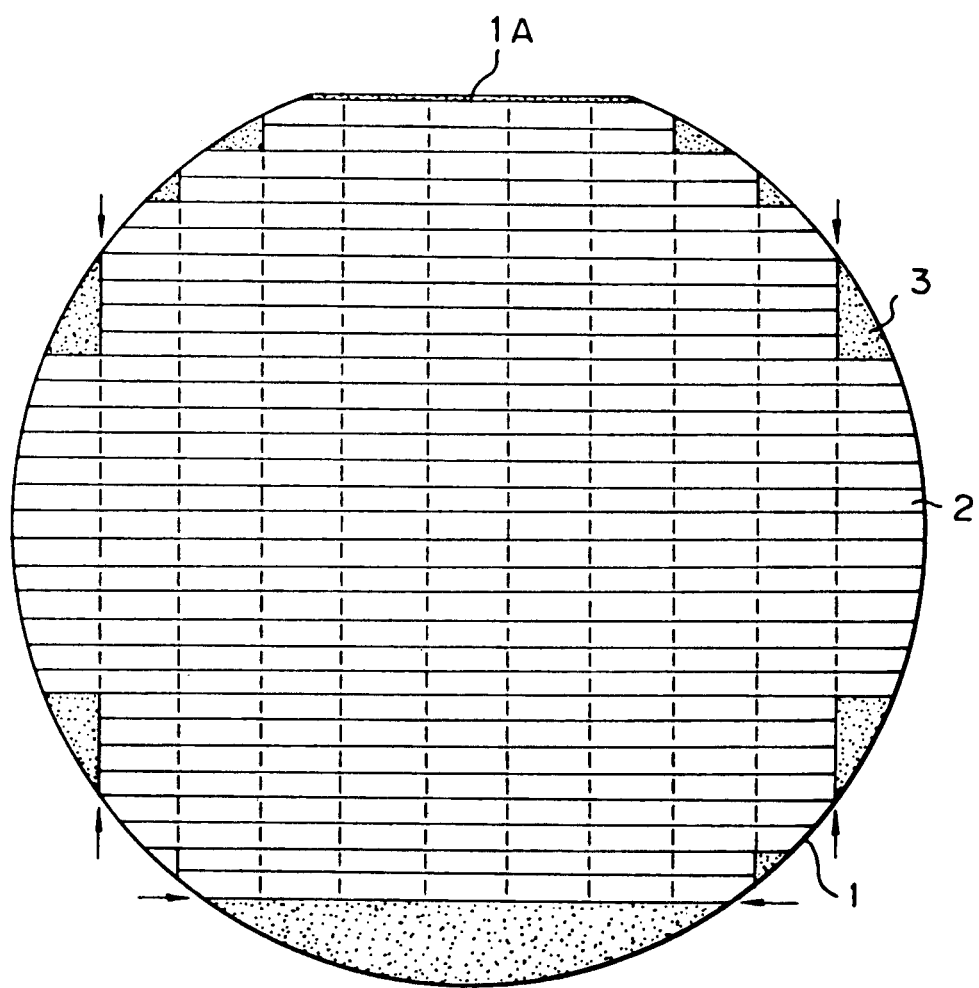
FIG. 1 is a plane view for explaining a configuration of a wafer used for a wafer scale integration device.

FIG. 1 is a plane view for explaining a configuration of a wafer used for a wafer scale integration device. In FIG. 1, reference 1 denotes a wafer, 1A denotes an orientation flat, 2 denotes a chip, and 3 denotes a metal film.

As shown in FIG. 1, a metal film 3 which is indicated by a sand pattern, remains at some portions in the circumference of the wafer 1. These portions of the metal film are deposited in a sputtering process for forming electrode wiring, which remains in a processing stage of patterning without being eliminated, because a reticle for providing a pattern cannot be shot at some portions in the surounding areas of the wafer due to the relationship of a stepper in an exposure apparatus, and a positive type resist is used for a photo resist. This metal film 3 remains after cutting the wafer 1 for mounting on the carrier, and a problem which will be described below arises due to the remaining metal film 3.

Figure 2:
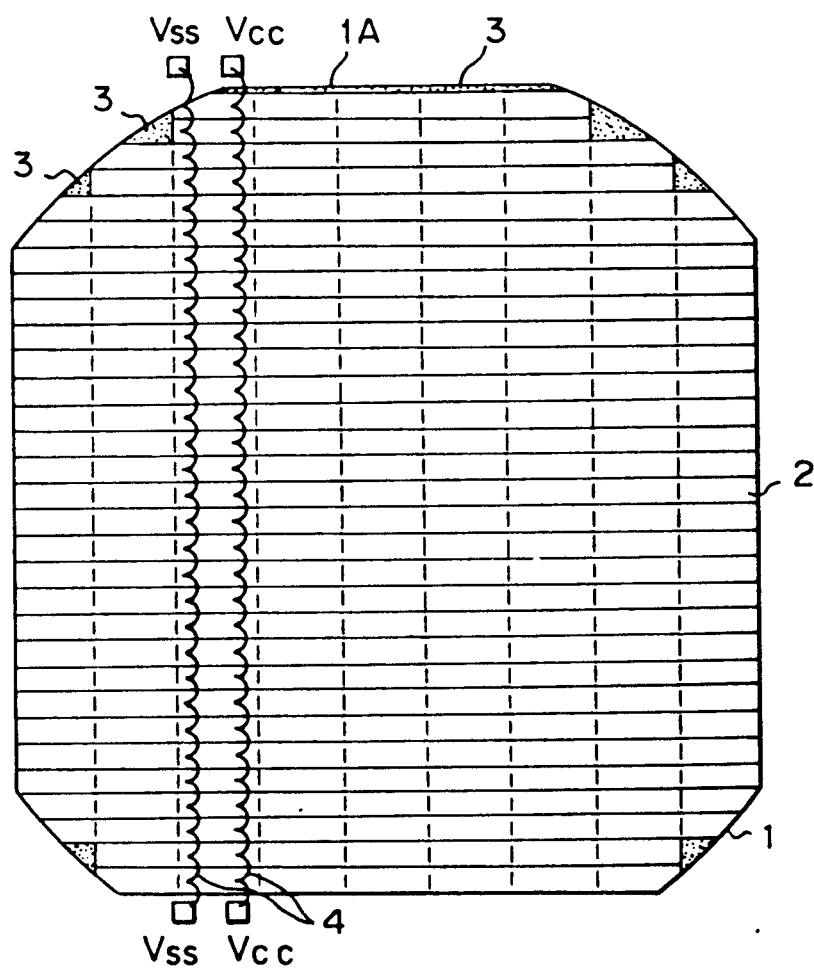
FIG. 2 is a plane view showing cutting of the wafer shown in FIG. 1.

FIG. 2 is a plane view showing cutting of the wafer shown in FIG. 1. In FIG. 2, reference 4 denotes power supply lines each consisting of power supply lines of Vcc and Vss. These power supply lines 4 are bonding wires made of, for example, aluminium, and the bonding wires are formed by using a stitch bonding technique. In the stitch bonding technique, the bonding wire can be continuously bonded to a metal pad formed on each chip without cutting the bonding wire. When power supply lines 4 which are Vcc lines or Vss lines are constituted by bonding wires instead of the metal wiring formed on the wafer, a potential drop in the supply voltage will not be caused by low impedance characteristics of each of the bonding wires. Namely, all chips connected with the bonding wires are supplied with sufficient power supply voltages.

As shown in FIG. 2, all sides of the wafer 1 are cut by cutting lines, which are indicated by arrow marks in FIG. 1, in order to be mounted on the carrier. It is obvious from FIG. 2, that the metal film 3 remains at corner portions and the orientation flat 1A of the wafer 1 after cutting the wafer 1 in a square shape.

Note, the metal film 3 remains at the corner portions and the orientation flat 1A, and the power supply lines 4 may be short-circuited by the remaining metal film 3. Namely, when using bonding wires for the power supply lines 4 of the Vcc lines and the Vss lines, resistance values of the power supply lines are decreased, but the bonding wires, especially at the edge portion of the wafer, may be short-circuited with the remaining metal film 3.

Figure 3:
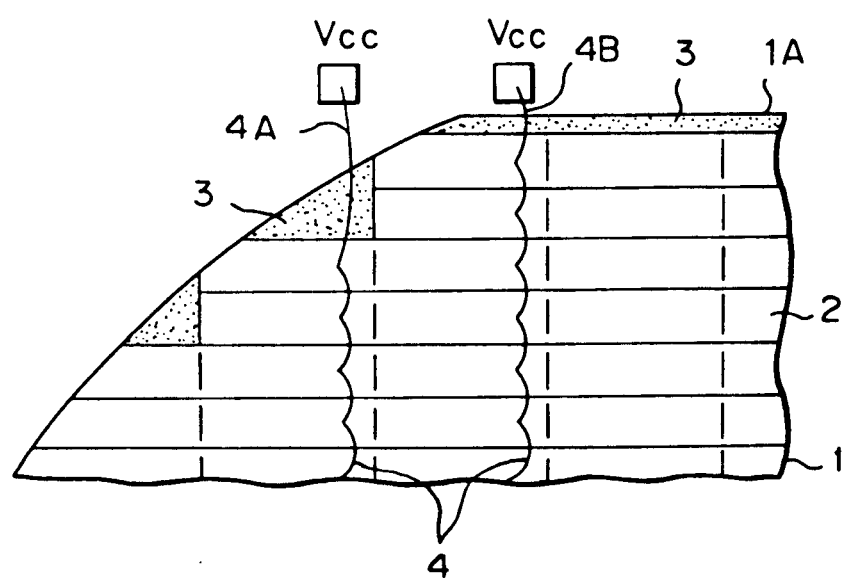
FIGS. 3 to 5 are enlarged plane views of a main portion of the wafer for explaining problems.

FIG. 3 is an enlarged plane view of a main portion of the wafer for explaining problems of the wafer scale integration device in FIG. 2. In FIG. 3, references 4A and 4B denote long wiring portions of the power supply lines 4.

It is obvious from FIG. 3, that a long wire is required for each of the wiring portions 4A and 4B of the power supply line 4 for connecting from the outside of the wafer 1 to a metal pad in outermost chips 2 formed in the wafer 1. Particularly, the long wiring portion 4A is located between a Vcc terminal existing at an ou...ue portion of the wafer 1 and a chip 2 existing at a corner of the wafer 1 and at that portion 4A the wire tends to touch the edge of the wafer 1. Therefore, the long wiring portion 4A may be short-circuited by the metal film 3 located below the long wiring portion 4A. Further, the long wiring portion 4B may also be short-circuited by the metal film 3 close to the orientation flat 1A, however, the long wiring portion portion 4B is not longer than the long wiring portion portion 4A.

In order to mount the wafer on the carrier, the wafer is formed by cutting from a shape shown in FIG. 1 to a square shape shown in FIG. 2. Note, in the process of cutting the wafer 1 to the square shape, the wafer 1 of FIG. 1 is cut by a cutting blade at arrow positions indicated in FIG. 1. However, when a reticle corresponding to the cutting region of the wafer is not shot due to the relationship of a stepper in an exposure apparatus and the like, a metal film 3 made of aluminium and the like or a cover film made of phosphosillicate glass (PSG)+SiN and the like still exist on the cutting region. Therefore, when the cutting region is cut by the cutting blade directly, slivers of aluminum and the like are produced. These slivers may stick to the chips 2 of the wafer 1, so that reliability of the system may be decreased. Furthermore, cutting accuracy may be decreased since the cover film made of PSG+SiN is very hard.

Figure 4:
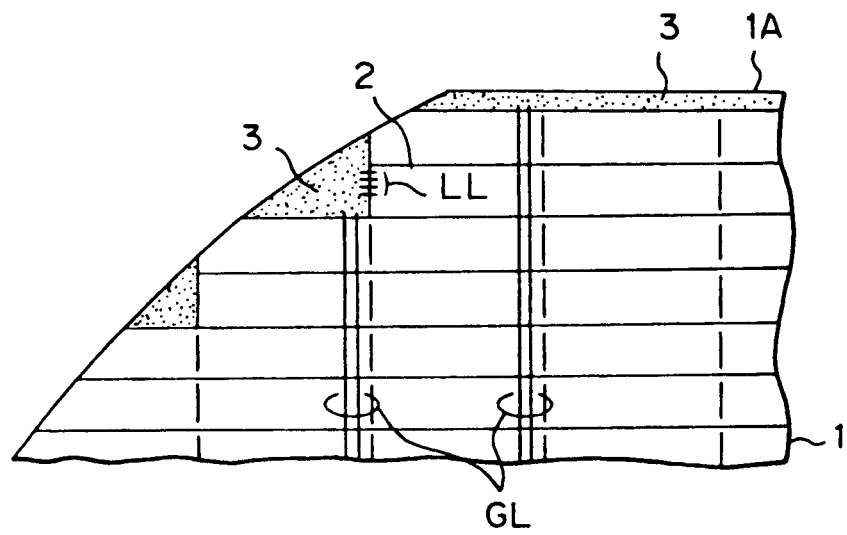

FIG. 4 is an enlarged plane view of a main portion of the wafer. In FIG. 4, reference LL denotes a local line, and GL denotes a global line, respectively.

Generally, end portions of the local lines LL and the global lines GL extend from a space of the specific chip 2 to an outside of the specific chip 2, that is, the local lines LL and the global lines GL extend to the neighbouring chip of the specific chip 2 for connecting with the local lines LL and the global lines GL of the neighboring chips.

Figure 5:
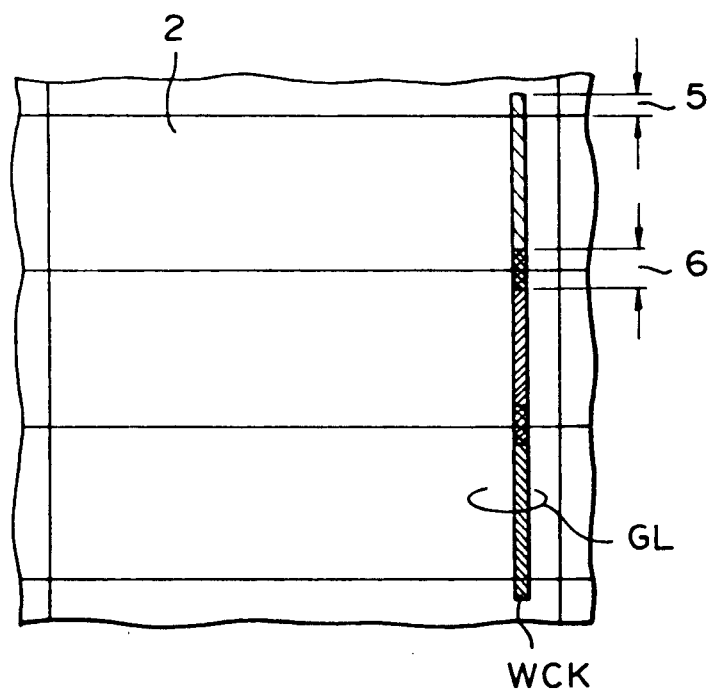

FIG. 5 is an enlarged plane view of a main portion of the wafer for explaining that the global line of the wafer clock line is extended to the neighboring chip through a space of a specific chip 2. Note, in FIG. 5, the global line GL is described by only a wafer clock line, for the sake of simplicity. In FIG. 5, reference 5 denotes an extending portion of the WCK line, and 6 denotes an overlapping portion of the WCK line.

As shown in FIG. 5, the wafer clock line WCK has an extending portion 5, the wafer clock line WCK is longer than a size of the chip 2, and an electrical contact is provided with the overlapping portions 6 of the WCK lines by forming the wafer clock lines WCK including the extending portion 5. The other lines, for example, the command lines and the local lines, are the same as the wafer clock line WCK, and these lines are formed successively at a specific pitch without programming a special program in the exposure apparatus.

It is obvious, when the metal film exists at the neighboring portions of the chip 2, that the wafer clock lines WCK and the like, may be short-circuited by the metal film 3. Namely, in the outermost chips 2, the local lines LL and the global lines LL extend to the metal film 3, and then the local lines LL and the global lines GL may be short-circuited by the metal film 3.

The above described problems with reference to FIGS. 1 to 5 are solved by the wafer scale integration device shown in FIGS. 6 to 10. The improved wafer scale integration device will be described with reference to FIGS. 6 to 10, wherein the same references in FIGS. 6 to 10 as in FIGS. 1 to 5 indicate the same portions or the same meanings as in FIGS. 1 to 5.

Figure 6:
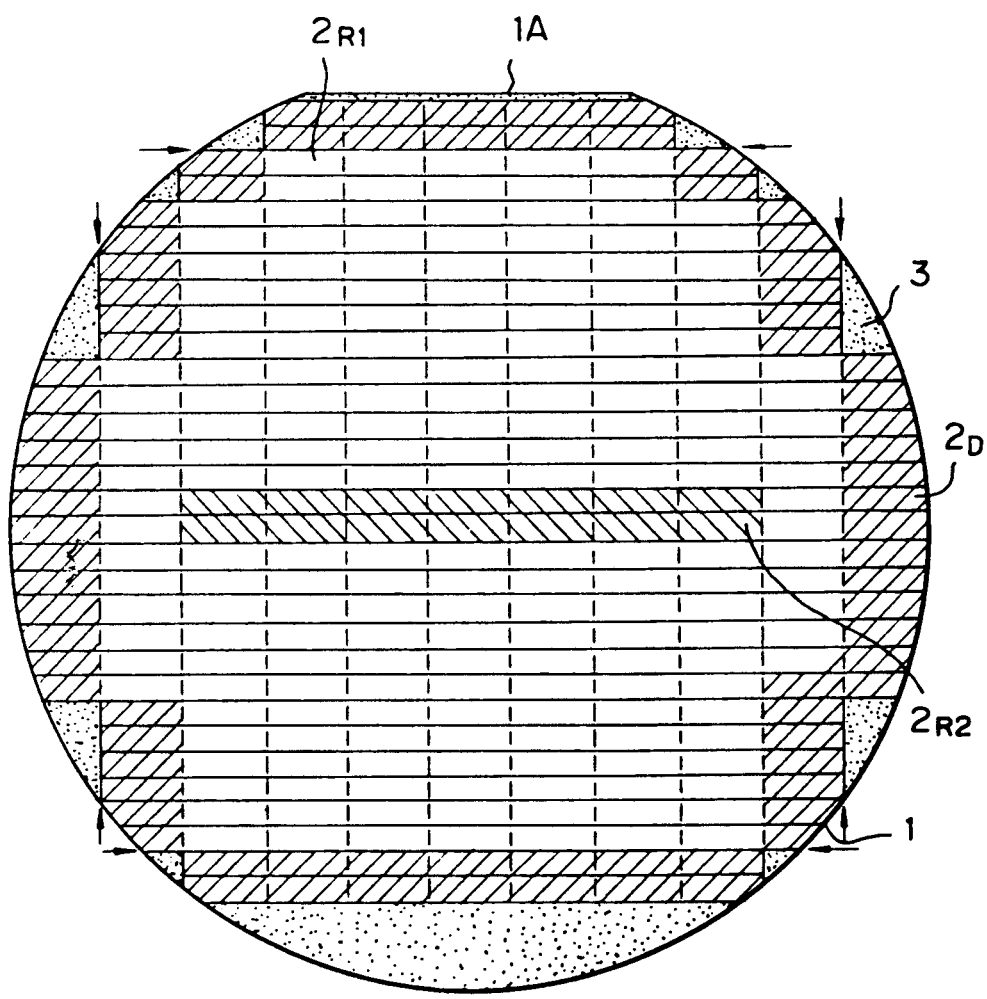
FIG. 6 is a plane view for explaining a configuration of a wafer used for a wafer scale integration device of an embodiment according to the present invention.

FIG. 6 is a plane view for explaining a configuration of a wafer used for a wafer scale integration device of an embodiment according to the present invention. In FIG. 6, references $2_{R1}$ and $2_{R2}$ denote real chips having an actual circuit, and $2_D$ denotes a dummy chip having no actual circuit. Note, the actual circuit is, for example, a memory circuit and a logic circuit for actual use.

In FIG. 6, the dummy chips $2_D$ are indicated by hatching lines from the upper right side to the lower left side and are located on the chip the same as the real chips 2 shown in FIGS. 1 to 5. Each of the real chips $2_{R1}$ which are indicated by a blank includes global lines for transmitting common signals and local lines for electrically connecting each of the real chips with its neighboring real chips. The global lines comprise a wafer clock line WCK for transmitting a wafer clock signal and a command line CMND for transmitting a command strobe signal.

In the real chips $2_{R2}$, which are arranged as an array of X-direction in the center of the wafer 1 and indicated by hatching lines from the upper left side to the lower right side, global lines GL are divided close to the boundary portion between the real chip $2_{R2}$ and its neighboring real chip. Each of the dummy chips $2_D$ has a plurality of metal pads made of aluminium and the like for relaying a bonding wire, each of the metal pads is at an electrically floating state. Note, each of the dummy chips $2_D$ does not include an actual circuit, and each of the real chips includes metal pads for receiving the power supply voltages and the like. Further, in the circumference of the dummy chip a metal film and a passivation film are not provided, but a scribe line is provided. It is obvious from FIG. 6, that the dummy chips $2_D$ are formed in the circumference of the wafer 1 instead of real chips 2 in the circumference of the wafer 1 shown in FIG. 1. When the real chips are formed in the circumference of the wafer, almost all of the real chips in the circumference of the wafer do not operate by due to defects, such as short circuit of the power supply voltages and the like. In this embodiment of the present invention, such defective real chips $2_{R1}$ are not formed, but the dummy chips $2_D$ are instead formed in the circumference of the wafer 1.

Figure 7:
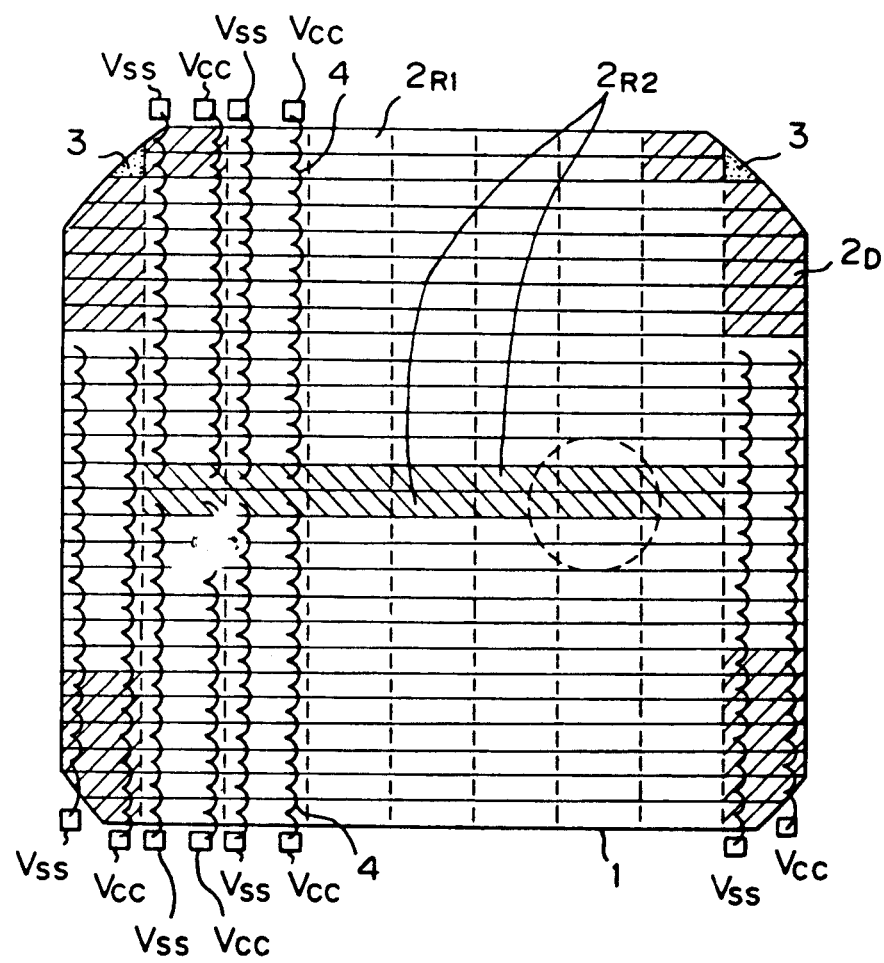
FIG. 7 is a plane view showing cutting of the wafer shown in FIG. 6.

FIG. 7 is a plane view showing cutting of the wafer 1 to a square shape suitable for mounting on the carrier. As shown in FIG. 7, all sides of the wafer 1 are cut by cutting lines, which are indicated by arrow marks in FIG. 6, in order to be mounted on the carrier. As described above, in a wafer scale integration device of the present invention, a plurality of dummy chips $2_D$ are formed in the circumference of the wafer 1. Therefore, when power lines 4 such as the Vcc and Vss lines are constituted by bonding wires, the dummy chips $2_D$ can be used for relay points for relaying the bonding wires, and thus the length of the long wiring portions can be shortened.

As shown in FIGS. 6 and 7, when a side of the orientation flat 1A is brought to an upper position, in both the left and right upper corners, where even the dummy chips cannot be shot, long wiring would be required for these upper corners. In the wafer scale integration device shown in all of the drawings, the center point of the pattern is shifted toward the orientation flat side away from the center point of the wafer 1, however, in general pattern printing, the center point of the pattern is con..istent with the center point of the wafer 1. Namely, in the wafer scale integration device of the present invention, all of the chips are shifted to the orientation flat side at the time of pattern printing to enable a length of the long wiring to be as short as possible.

As described above, in the wafer scale integration device of the present invention, a printing pattern of the chips is formed by shifting the pattern toward the orientation flat side as compared with the prior. Therefore, in the left and right upper corners, where long wiring is required, the length of the wire becomes shorter than in the prior art. Further, after cutting the lower side which is opposite the orientation flat 1A, the metal film 3 does not remain at the left and right lower corners, and thus the length of the bonding wire becomes shorter. Note, in the wafer scale integration device in the prior art, which is not shown in the drawings, the chip patterning is formed at a position shifted toward the lower side compared with the wafer scale integration device of the present invention.

Figure 8:
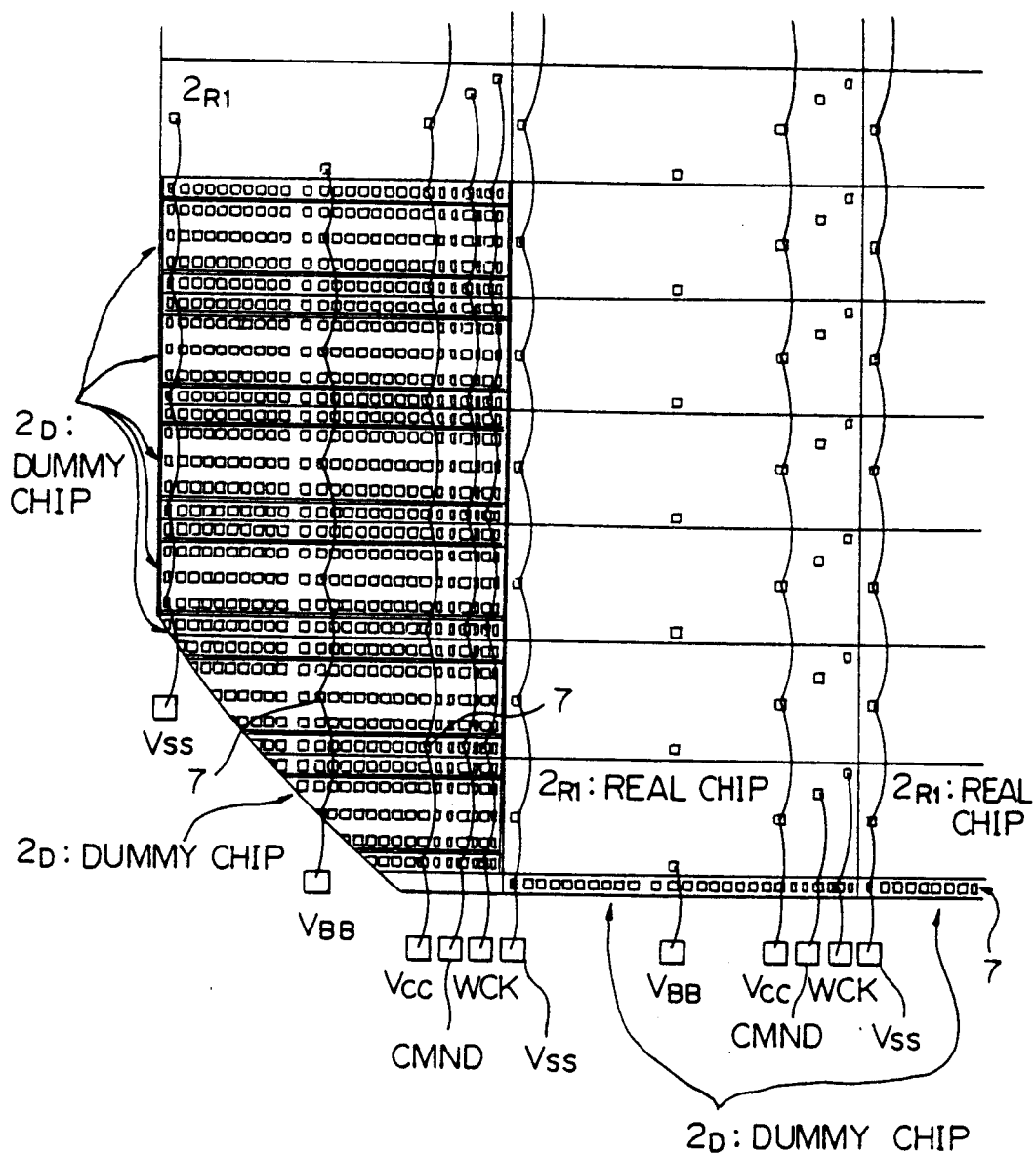
FIG. 8 is an enlarged plane view of a main portion of the wafer shown in FIG. 6.

FIG. 8 is an enlarged plane view of a lower left corner portion of the wafer 1. In FIG. 8, reference 7 denotes a metal pad of a relay point in the dummy chip $2_D$, CMND denotes a command line, and $V_{BB}$ denotes a substrate voltage line.

As shown in FIGS. 7 and 8, in longitudinal chip arrays in both left and right sides of the cut wafer 1, the power supply lines 4 of the Vss and Vcc lines are applied to the real chips $2_{R1}$ through a plurality of dummy chips $2_D$. The bonding wires used for the power supply lines 4 at the left and right sides are relayed by a plurality of metal pads corresponding to the dummy chips $2_D$, and the relayed bonding wires are connected to the metal pads of the real chips $2_{R1}$. Namely, the power supply lines 4 are wired from the lower left and right corners through the dummy chips $2_D$. Note, in the real chips $2_{R2}$, the global lines GL are divided close to the boundary portion between the real chip $2_{R2}$ and its neighboring real chip. As described above, the power supply lines 4 are not short-circuited by the metal film 3 at the edge portions of the wafer 1. Further, the metal film 3 is also not formed in the circumference of the wafer 1 and the metal film 3 is not formed in the circumference of the dummy chips $2_D$, and the global lines GL and the local lines LL which extend from a space between the specific real chip to the neighboring area of the specific real chip are not short-circuited by the metal film 3.

Figure 9:
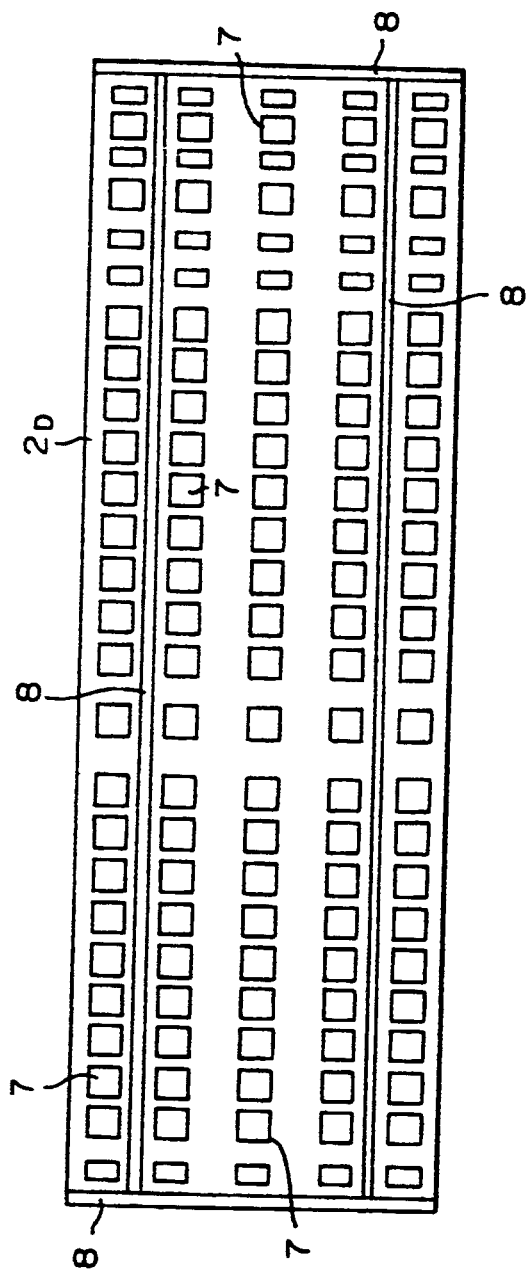
FIG. 9 is an enlarged plane view of a main portion of the wafer for explaining a dummy chip.

FIG. 9 is an enlarged plane view of one of the dummy chips $2_D$, and reference 8 denotes a scribe line.

When forming the dummy chips $2_D$ shown in FIG. 9 on the wafer 1, metal pads 7 made of aluminium and a cover film (which is not indicated in the drawing) are printed on the dummy chip $2_D$, and the other processes are not carried out. Note, the scribe line 8 is formed in the circumference of the dummy chip $2_D$ and the scribe line 8 does not include metal film 3 made of aluminium and the cover film made of PSG+SiN. Therefore, when cutting the wafer along the scribe line 8, slivers of aluminium do not cling to the chip, and thus reliability is not decreased. As shown in FIG. 8, in the lower side opposite the orientation flat 1A, one array of metal pads for relay points remain, this metal pad array is used for a countermeasure of the long wiring.

Figure 10:
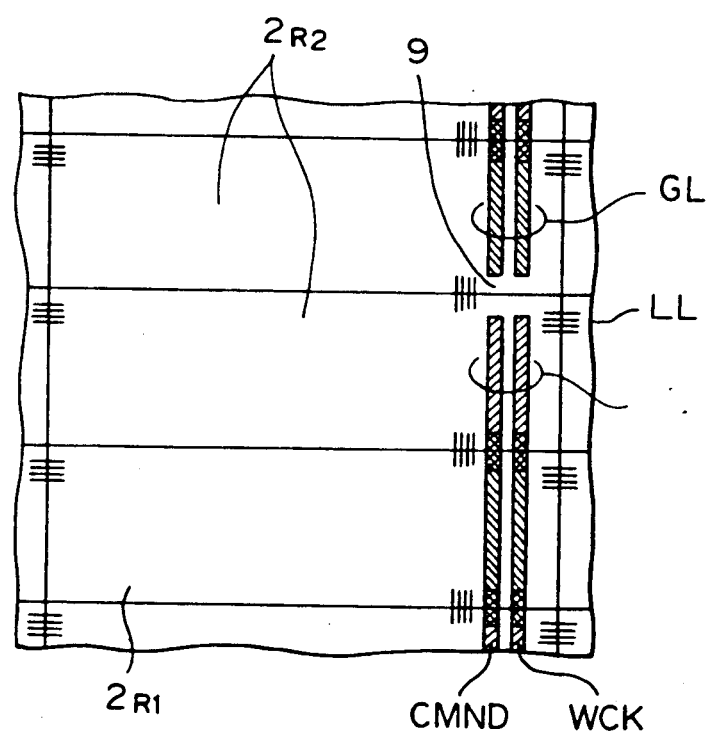
FIG. 10 is an enlarged plane view of a main portion of the wafer for explaining a real chip having divided global lines.

FIG. 10 is an enlarged plane view of a circular portion indicated by a broken line in FIG. 7, and reference 9 denotes a dividing portion of the global lines GL of real chips $2_{R2}$ close to the boundary portion between the real chips $2_{R2}$.

A configuration as shown in FIG. 10 is very useful for bypassing defective chips and passing only operative real chips $2_{R1}$ in serial from an input end to an output end. Namely, when one array of the chips of Y-direction cannot be used due to a short circuit of the power supply lines 4, the local lines LL cannot be passed through the defective chip array, and thus a SPIRAL path cannot be constituted by connecting all real chips $2_{R1}$ in serial. In this case, a considerable number of real chips $2_{R1}$ become wasted. However, in accordance with the configuration of the present invention, in this case, the local lines LL can be detoured around the defective chip array by passing through the dividing portion 9, and thus the SPIRAL path can be constituted using the remaining operative real chips $2_{R1}$ the same as in an ordinary case.

As described above, in a wafer scale integration device according to the present invention, a plurality of dummy chips $2_D$ are selectively formed on an appropriate position in the circumference of a wafer 1. Each of the dummy chips $2_D$ include a plurality of metal pads 7 of a relay point formed on a surface of each of the dummy chips $2_D$ and a scribe line 8 which is cutting line formed on the circumference of the dummy chip, and a metal film 3 and cover film are not provided at the scribe line 8. Further, a plurality of real chips $2_{R1}$ and $2_{R2}$ are selectively arranged on an appropriate position in the center portion of the wafer. These real chips include an actual circuit and real pads for receiving power supply voltages, and the real chips also include global lines GL each consisting of a wafer clock line WCK and a command line CMND. The global lines GL are divided at a dividing portion 9 to enable passing through of local lines LL close to the boundary portion between the real chip and a neighboring chip thereof. The power supply lines 4 are constituted by a bonding wire for applying power supply voltages to a plurality of real chips without a potential drop.

By using the above construction, when a bonding wire is used for the power supply lines to supply current to each real chip, the power supply lines 4 are not short-circuited by the edge portions of the wafer, moreover, the global lines GL and the local lines LL do not short-circuit by the edge portions of the wafer 1. Further, when cutting the wafer 1 for mounting on the carrier, slivers of metal do not cling to the chip, and reliability is not decreased. Furthermore, it is possible for a SPIRAL path to be constituted by connecting operative chips using the local lines and not connecting defective chips.

Many widely differing embodiments of the present invention may be constructed without departing from the spirit and scope of the present invention, and it should be understood that the present invention is not limited to the specific embodiments described in this specification, except as defined in the appended claims.

I claim:

1. A wafer scale integration device comprising:
   a wafer;
   a plurality of real chips selectively formed in a center portion of said wafer, each of said real chips having an actual circuit and a plurality of real pads;
   a plurality of bonding wires which connect each of said real pads; and
   a plurality of dummy chips selectively formed in a circumference of said wafer, each of said dummy chips having only a plurality of relay pads, and some of said bonding wires being selectively connected to corresponding ones of said relay pads.

2. A wafer scale integration device according to claim 1, wherein said bonding wires connected to said relay pads used for supplying power voltages to said real chips.

3. A wafer scale integration device according to claim 1, wherein each of said real chips includes global lines for transmitting common signals and local lines for electrically connecting each of said real chips to neighboring real chips thereof, and said global lines close to the boundary portion between some of said real chips are two separate global lines to enable said local lines to pass through.

4. A wafer scale integration device according to claim 3, wherein said boundary portion between some of said real chips are arranged as an array in the center of said wafer.

5. A wafer scale integration device according to claim 3, wherein said global lines comprises a wafer clock line for transmitting a wafer clock signal and a command line for transmitting a command strobe signal.

6. A wafer scale integration device according to claim 1, wherein a metal film is not formed at the circumference of each of said dummy chips, so that said global lines and local lines do not short-circuit.

7. A wafer scale integration device comprising:
a wafer;
a plurality of real chips selectively formed in a center portion of said wafer, each of said real chips having an actual circuit; and
a plurality of dummy chips selectively formed in a circumference of said wafer, each of said dummy chips formed with only a plurality of relay pads for relaying bonding wires, each relay pad being in an electrically floating state, and each of said dummy chips includes a scribe line for cutting said wafer.

8. A wafer scale integration device according to claim 7, wherein a metal film and a cover film are not formed on said scribe line.

9. A wafer scale integration device according to claim 7, wherein each of said real chips includes global lines for transmitting common signals and local lines for electrically connecting each of said real chips to neighboring real chips thereof, and said global line close to a boundary portion between some of said real chips are two separate global lines to enable said local lines to pass through.

10. A wafer scale integration device according to claim 9, wherein said boundary portion between some of said real chips are arranged as an array in the center of said wafer.

11. A wafer scale integration device according to claim 9, wherein said global lines comprises a wafer clock line for transmitting a wafer clock signal and a command line for transmitting a command strobe signal.

12. A wafer scale integration device according to claim 7, wherein a metal film is not formed at the circumference of each of said dummy chips, so that said global lines and local lines do not short-circuit.

13. A wafer scale integration device comprising:
a wafer;
a plurality of real chips selectively formed in said wafer, each of said real chips having an actual circuit; and
a plurality of dummy chips selectively formed in a circumference of said wafer instead of real chips in said circumference of said wafer, each of said dummy chips formed with only a plurality of relay pads for relaying bonding wires, each relay pad being in an electrically floating state.

14. A wafer scale integration device according to claim 13, wherein each of said real chips includes global lines for transmitting common signals and local lines for electrically connecting each of said real chips to neighboring real chips thereof, and said global lines close to the boundary portion between some of said real chips are separated into two global lines to enable said local lines to pass between.

15. A wafer scale integration device according to claim 14, wherein said boundary portion between some of said real chips are arranged as an array in the center of said wafer.

16. A wafer scale integration device according to claim 14, wherein said global lines comprises a wafer clock line for transmitting a wafer clock signal and a command line for transmitting a command strobe signal.

17. A wafer scale integration device according to claim 13, wherein a metal film is not formed at the circumference of each of said dummy chips, so that said global lines and local lines do not short-circuit.

* * * * *